United States Patent [19]
Takiguchi et al.

[11] Patent Number: 5,931,682
[45] Date of Patent: Aug. 3, 1999

[54] CONNECTOR CONNECTING STRUCTURE

[75] Inventors: Shuji Takiguchi; Keizo Nishitani, both of Shizuoka, Japan

[73] Assignee: Yazaki Corporation, Tokyo, Japan

[21] Appl. No.: 08/893,551

[22] Filed: Jul. 11, 1997

[30] Foreign Application Priority Data

Jul. 15, 1996 [JP] Japan ................................... 8-185136

[51] Int. Cl.$^6$ ................................................. H01R 33/00
[52] U.S. Cl. .............................. 439/34; 439/77; 439/246; 174/72 A; 49/502; 296/146.7
[58] Field of Search ........................ 174/72 A; 439/34, 439/77, 246–248, 492, 494, 495, 499; 49/502; 296/146.7

[56] References Cited

U.S. PATENT DOCUMENTS

| | | |
|---|---|---|
| 4,062,617 | 12/1977 | Johnson . |
| 4,824,164 | 4/1989 | Nakayama et al. ............... 439/34 X |
| 4,848,829 | 7/1989 | Kidd ..................................... 439/34 X |
| 4,869,670 | 9/1989 | Ueda et al. ............................. 439/34 |
| 5,527,187 | 6/1996 | Jurasek et al. ...................... 439/246 X |

*Primary Examiner*—Khiem Nguyen
*Attorney, Agent, or Firm*—Armstrong, Westerman Hattori, McLeland & Naughton

[57] ABSTRACT

A connector connecting structure capable of smoothly connecting connectors, for example, on a vehicle door trim and on a door panel respectively, even in case of the door trim slantingly approaching the door panel. A projection having a terminal conductor is orthogonally arranged on a substrate and is rotatable about a flexible portion as a supporting point, while a slant guide corresponding to the projection is formed on a connector corresponding to the projection for enabling the projection to be inserted into the connector slidingly and rotatively along the slant guide. Practically, a vehicle door trim functions as a substrate and a connector is provided on a vehicle door panel for enabling a projection on the door trim to be inserted into the connector upon rotative assemblage of the door trim onto the door panel. Further, a projection is formed long into a rig and a connector has a rib insertion space having an opening from the front portion throughout the longitudinal ends and also a plurality of connectors are arranged in a line for enabling the plurality of connectors to be simultaneously connected with the projection.

2 Claims, 6 Drawing Sheets

CONNECTOR CONNECTING STRUCTURE

BACKGROUND OF THE INVENTION

1. Field of the Invention

The present invention relates to a connector connecting structure capable of smoothly connecting connectors, wherein, for example, connectors on a vehicle door panel and on a vehicle door trim are smoothly connected simultaneously with the assemblage of the door trim onto the door panel.

2. Description of the Prior Art

FIG. 8 shows a connecting structure of a vehicle door circuit unit disclosed in Japanese Patent Publication No. Heisei 8-128699.

In this structure, various accessories 67,68,69,70, and 71 and circuit units (flexible flat circuit units) 72 and 73 connected to the above accessories are installed on an inner door panel 65 or on a door trim 66 for enabling ito connect the circuit units 72 and 73 upon assemblage of the door trim 66 onto the inner door panel 65.

On the inner door panel 65, accessories such as a speaker 67 and a door lock 68 are installed, further, a connector 75 for a door mirror driving unit on an outer door panel 74, another connector 76 for the circuit unit 73 on the door trim, and the circuit unit 72 connecting the accessories 67 and 68 or the connectors 75 and 76 are installed.

On the other hand, various switches 69 and 70 and the door lamp 71 are installed on the face of the door trim 66 and the circuit unit 73 connected with them is also installed on the back of the door trim 66. The circuit unit 73 has a connector 78 corresponding to the connector 76 on the inner door panel 65.

As shown in FIG. 9, the connector 78 is made by arranging terminals 62 of the flexible flat circuit unit 73 within a opening of a substrate 64 made of a synthetic resin. The terminal 62 has an exposed conductor 62a.

Referring to FIG. 8, the door trim 66 is assembled onto the inner door panel 65 after assemblage of the inner door panel 65 onto the outer door panel 74. The male connector 76 of the door panel side is inserted into the female connector 78 of the door trim side in an arrow-direction Z4 in FIG. 9, and the connectors 76 and 78 are electrically connected with a contact between an exposed conductor 61 on an outer surface of the male connector and the exposed conductor 62a on an inner surface of the female connector.

However, there has been a problem on the aforementioned prior art connector connecting structure that connection work is not easy, that is, an engagement between the connectors 76 and 78 would not be performed well if the door trim 66 is aslant even a little upon assemblage of the door trim 66 onto the door panel.

SUMMARY OF THE INVENTION

An object of the present invention is to provide a connector connecting structure, wherein an engagement between connectors, for example, on a vehicle door trim and on a vehicle door panel are smoothly and surely performed even if the door trim is aslant upon assemblage of the door trim onto the door panel.

In order to achieve the above objective, the present invention adopts a connector connecting structure, wherein a projection having a terminal conductor is orthogonally arranged on a substrate and is rotatable about a flexible portion as a supporting point, while a slant guide corresponding to the projection is formed on a connector corresponding to the projection fbr enabling the projection to be inserted into the connector slidingly and rotatively along the slant guide.

Another object of the present invention is to provide a connector connecting structure, wherein a vehicle door trim functions as a substrate and a connector is provided on a vehicle door panel for enabling a projection on the door trim to be inserted into the connector upon rotative assemblage of the door trim onto the door panel.

Still another object of the present invention is to provide a connector connecting structure, wherein a projection is formed long into a rib and a connector has a rib insertion space having an opening from the front portion throughout the longitudinal ends and also a plurality of connectors are arranged in a line for enabling the plurality of connectors to be simultaneously connected with the projection.

DETAILED DESCRIPTION OF THE PREFERRED EMBODIMENTS

The present invention will be described in further detail with reference to the accompanying drawings.

Figure 1:
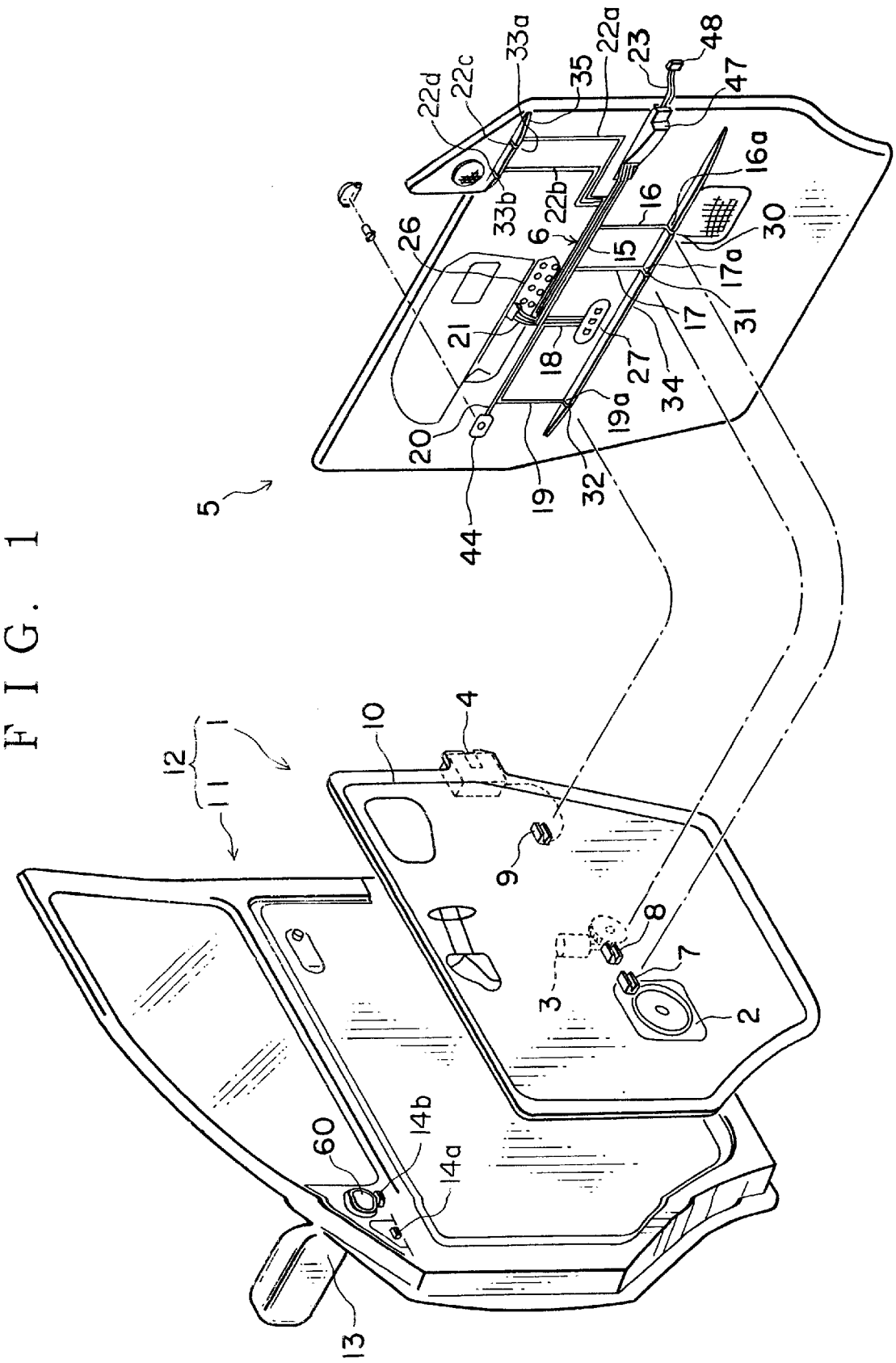
FIG. 1 is an exploded perspective view showing a connecting structure of a vehicle door circuit unit having a connector connecting structure in accordance with the present invention.

FIG. 1 shows a connecting structure of circuit units on a vehicle door having a connector connecting structure in accordance with the present invention.

According to the present embodiment, a circuit unit 6 is concentrated on a vehicle door trim 5 without installing it on an inner door panel 1, and only accessories such as speaker unit 2, power-window unit 3, and door-lock. unit 4 are installed on the inner door panel 1.

The accessories 2, 3 and 4 installed on the inner panel 1 are arranged in about the vertical middle of the inner panel 1 in about a horizontal line. Each of the accessories 2–4 is provided with each of connectors 7,8, and 9, which are also arranged in about the vertical middle of the inner panel 1 in a horizontal line. Surface of the inner panel 1 is covered with a waterproof sheet 10, through which each of the connectors 7–9 is projecting toward the door trim 5.

Figure 2:
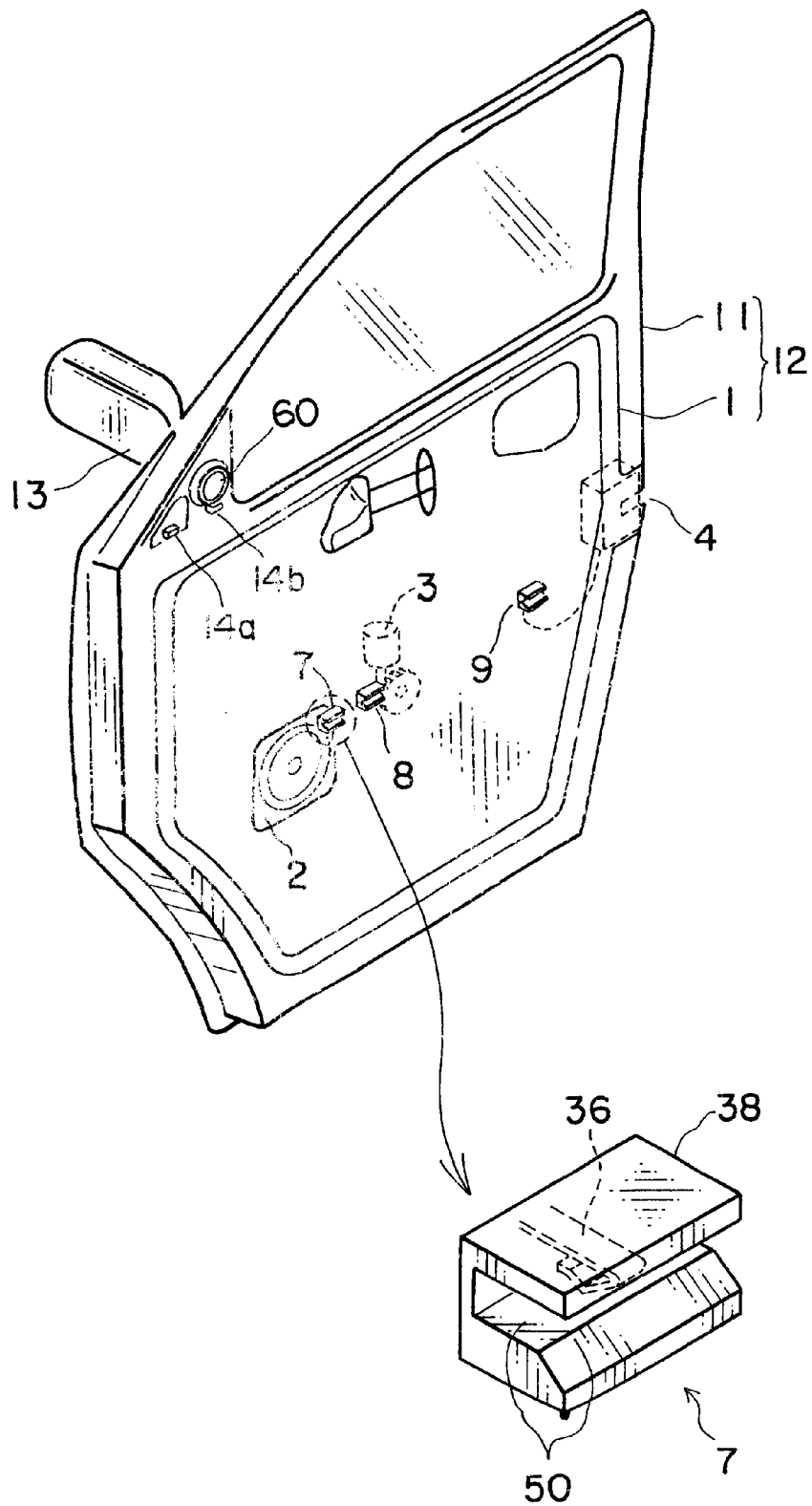
FIG. 2 is a perspective view showing a door panel having the connector connecting structure in accordance with the present invention.

As shown in FIG. 2, the inner panel 1 is assembled to an outer door panel 11, and they constitute a door panel 12. The outer panel is provided, on its upper portion, with a door-mirror driving unit 13, a sub-speaker 60, and respective connectors 14a and 14b being independent of the connectors on the inner panel 1.

Referring to FIG. 1, the circuit unit 6 is arranged on a back surface of the door trim 5. The circuit unit 6 includes a main circuit 15 and branch circuits 16,17,18,19,20,21,22a, and 22b, wherein the former, lying in relatively upper part of the door trim 5, extends horizontally and the latter each extend vertically or horizontally from the former. The vertical branch circuits 18 and 21 are respectively connected to a contacts-portion 26 of a main switch unit (not shown) and to another contacts-portion 27 of an option switch unit (not shown).

In FIG. 1, the vertical branch circuits 16,17,19,22a, and 22b each extend to about the vertical middle or to the upper part of the door trim 5, then constituting connectors 30,31, 32,33a, and 33b respectively corresponding to the connectors 7,8,9,14a, and 14b on the door panel 12.

Specifically, horizontal ribs (projections) 34 and 35 are projectingly formed respectively in about the vertical middle and in the upper part (a triangular portion) of the door trim 5, and the circuits 16,17,19,22a, and 22b are respectively provided, at their ends, with exposed terminal conductors 16a,17a,19a,22c, and 22d so as to make connectors 30,31, 31,33a, and 33b. The ribs 34 and 35 are formed integrally with the door trim 5 made of synthetic resin.

The circuit unit 6 is three-dimensionally formed integrally with the door trim 5 by an existing method such as two shot method or an additive method, for which a circuit unit plated on the door trim 5, a flexible flat circuit unit, a wire harness with covered wires, or else capable of forming an exposed conductor on a surface of a rib may substitute.

Figure 3:
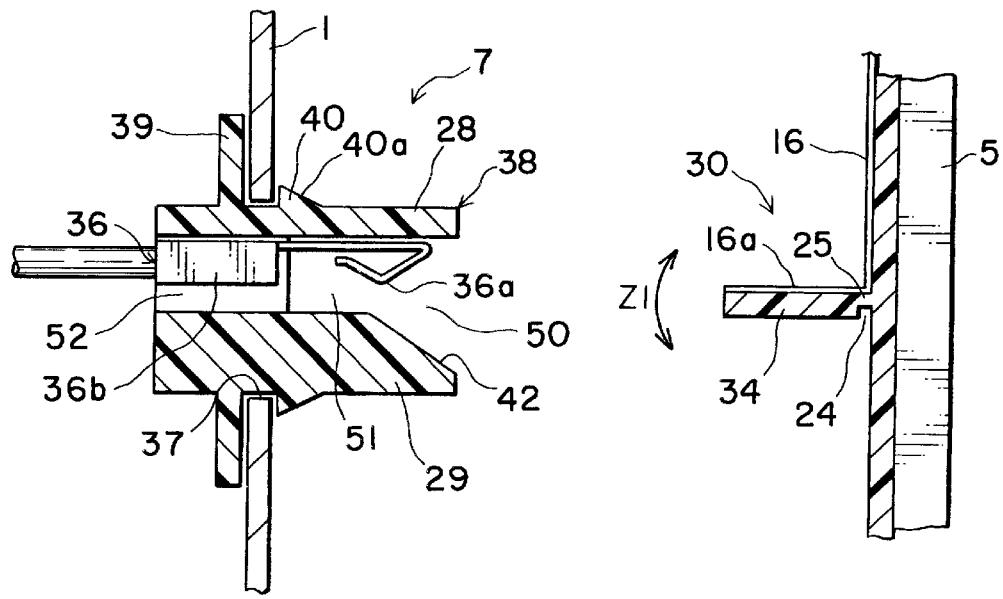
FIG. 3 is a cross-sectional view showing an embodiment of the connector connecting structure in accordance with the present invention.

FIG. 3 shows an embodiment of the connector connecting structure in accordance with the present invention.

A groove 24 is transversely formed downward at the root of the rib 34, made of an insulating resin, projecting orthogonally on the door trim (a substrate) 5, thus forming a thin flexible portion 24. The flexible portion 25 enables the rib 34 to rotatively move in an arrow-direction Z1 in a vertical plain.

The exposed terminal conductor 16a following the branch circuit 16 is formed on the upper surface of the rib 34. As mentioned above, the circuit 16 and the terminal conductor 16a are three-dimensionally formed upon forming of the door trim 5, or formed as a printed circuit after forming of the door trim 5. The connector 30 consists of the door trim (substrate) 5, the flexible rib 34, and the terminal conductor 16a following the circuit 16.

The connector (female connector) 7, corresponding to the connector 30, on the inner door panel 1 consists of a connector housing 38, made of synthetic resin and having a substantially U-shaped cross section, and a terminal 36 engaging with the internal of the housing 38. A flange 39 is projectingly formed integrally with the housing 38 at the rear periphery, and a locking projection 40 is also formed in front of the flange 39. The locking projection 40 has at the front a slant portion 40a for enabling an engagement with a connector attachment hole 37 on the inner panel 1 by guiding the hole 37 along the slant portion 40a to between the locking projection 40 and the flange 39. The connector 7 projects orthogonally on the inner panel.

The connector housing 38, as shown in FIG. 2, has an insertion opening 50 at the front portion throughout the longitudinal ends, and has a rib insertion space 51 grooved, corresponding to the rib 34 being wide, between upper and lower wall portions 28 and 29. In FIG. 2, the wide ribs 34 are simultaneously inserted into each insertion spaces 51 of the plurality of connectors 7–9 lying in a line.

Referring to FIG. 3, the terminal 36 is engaged downward in an accommodation potion 52 in the connector housing 38. The terminal 36 has a wire connection portion 36b and a substantially L-shaped resilient contact piece 36a. The resilient contact piece is set downward in the rib insertion space 51.

A slant guide 42, corresponding to the rib 34, with a tapered surface is formed on the lower wall portion 29 of the connector housing 38 from the front end of the housing 38 to below the resilient contact piece 36a. Upon assembling the door trim 5 onto the door panel 12, even in case of the door rim 5 being inclined, the slant guide 42 enables the rib 34 to smoothly enter the connector 7 by guiding a tip of the flexible rib 34 along the guide 42.

Figure 4:
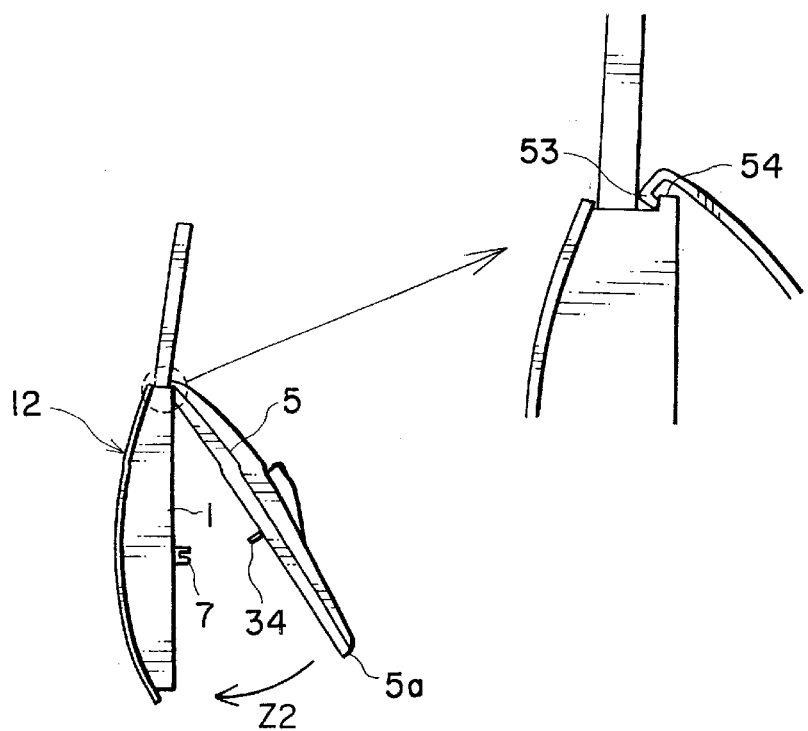
FIG. 4 is a side view showing an assembling method of a door trim.

FIG. 4 shows an example of an assembling method of the door trim 5 onto the door panel 12.

According to this method, a hook portion 53 on the top of the door trim 5 is hung on a projecting portion 54 positioned at a bottom portion of a window frame of the door panel 12, and the door trim 5 is rotated about the hook portion 53 in an arrow-direction Z2 and assembled onto the door panel 12. This method enables the trim 5 to be assembled onto the door panel 12 without a deflection by positioning the door trim 5 suitably with the hook portion 53.

Also with this assembling method, a connection between the connectors 7 and 30 is performed smoothly and surely by means of the flexible rib 34 and the corresponding slant guide 24 (shown in FIG. 3). When the door trim 5 is rotated, if a connector corresponding to the connector 30 is placed near an end portion 5a (shown in FIG. 4) naturally having a large radius of rotation, a smoother connection can be expected due to decrease of an inclination of a corresponding rib. However, as shown in FIG. 2, since the accessories 2–4 are arranged in about the vertical middle of the door panel 12, the above flexible rib 34 and the corresponding slant guide 42 are required in order to eliminate wiring work by applying of the connectors 7–9 direct-mounted on the accessories.

Figure 5:
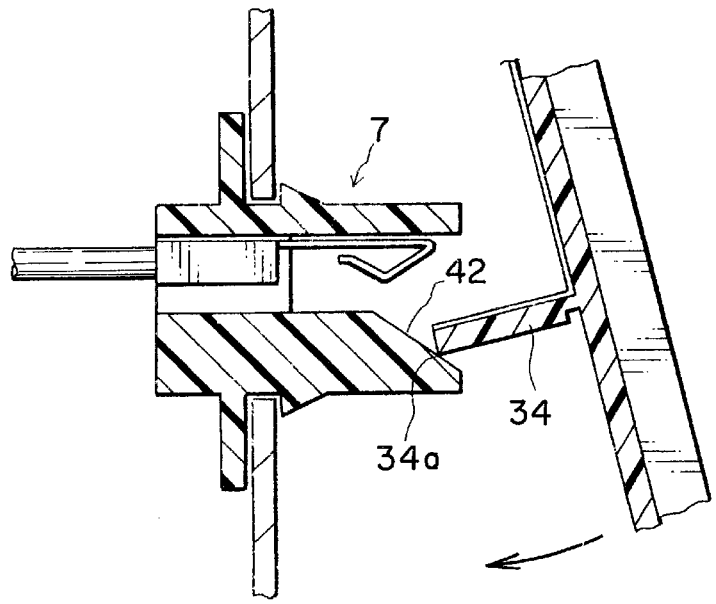
FIG. 5 is a cross-sectional view showing a state of a beginning of the connector connection of FIG. 3.
Figure 6:
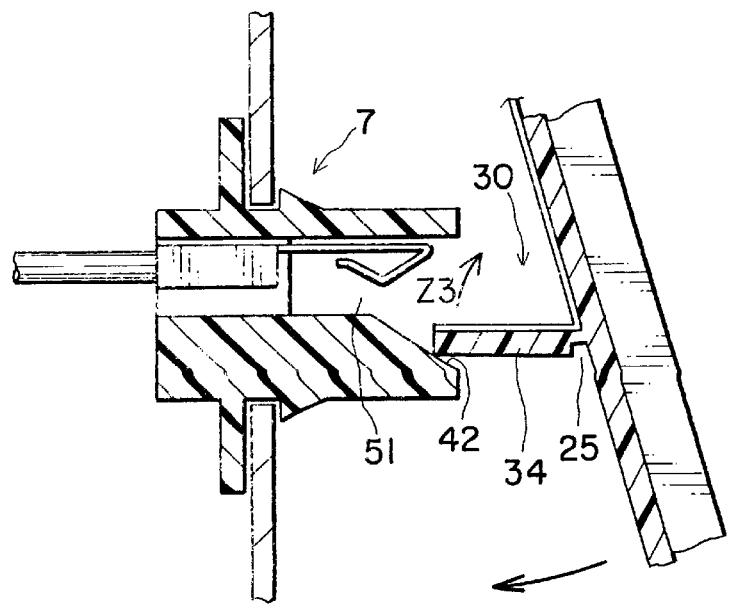
FIG. 6 is a cross-sectional view showing a state of an absorption of a deflection of the center during the connector connection of FIG. 5 by means of rotational motion of a rib functioning as a connector.
Figure 7:
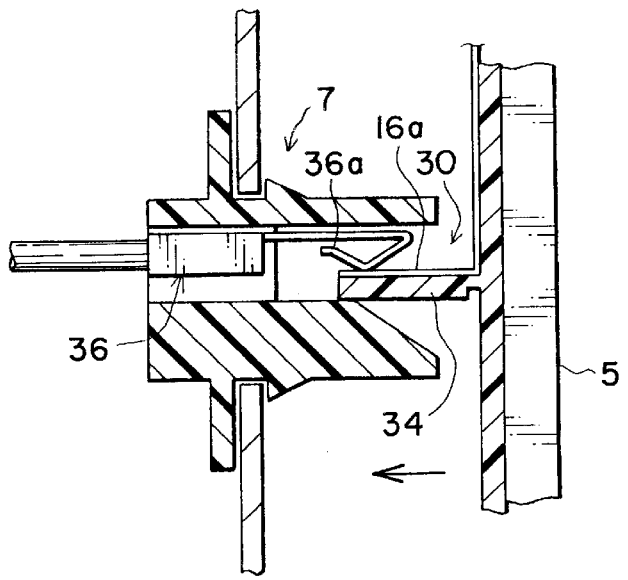
FIG. 7 is a cross-sectional view showing a state of completion of the connector connection of FIG. 6.
Figure 9:
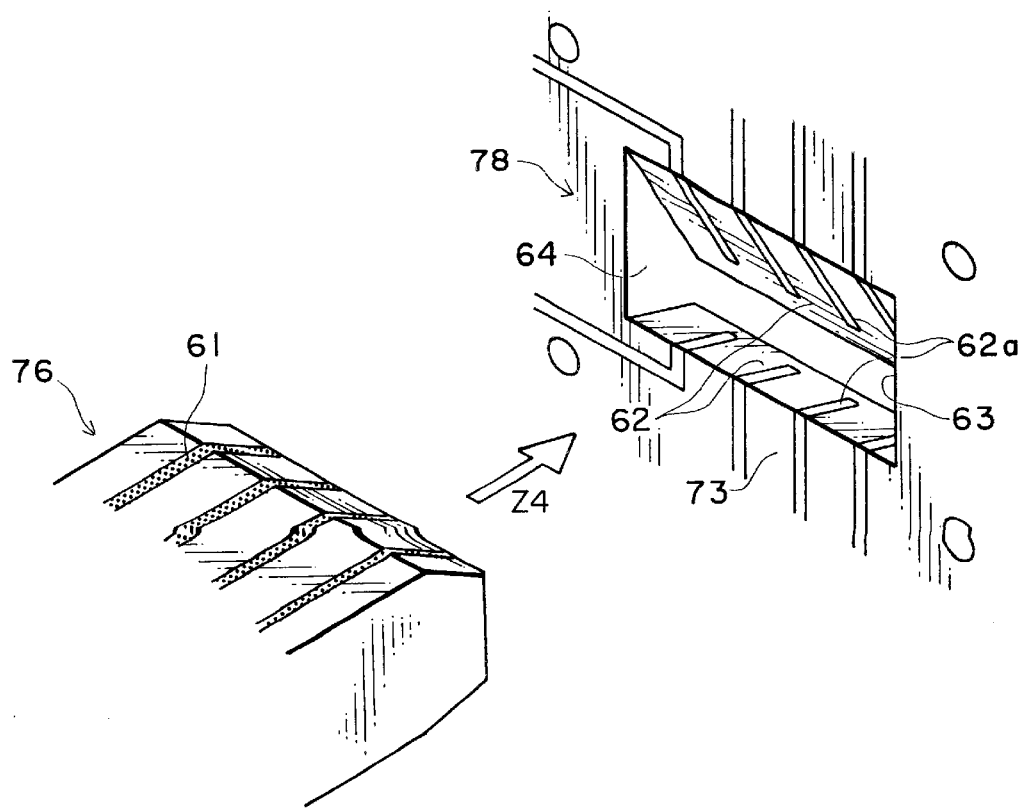
FIG. 9 is an exploded perspective view showing the connector connecting structure of FIG. 8.
Figure 8:
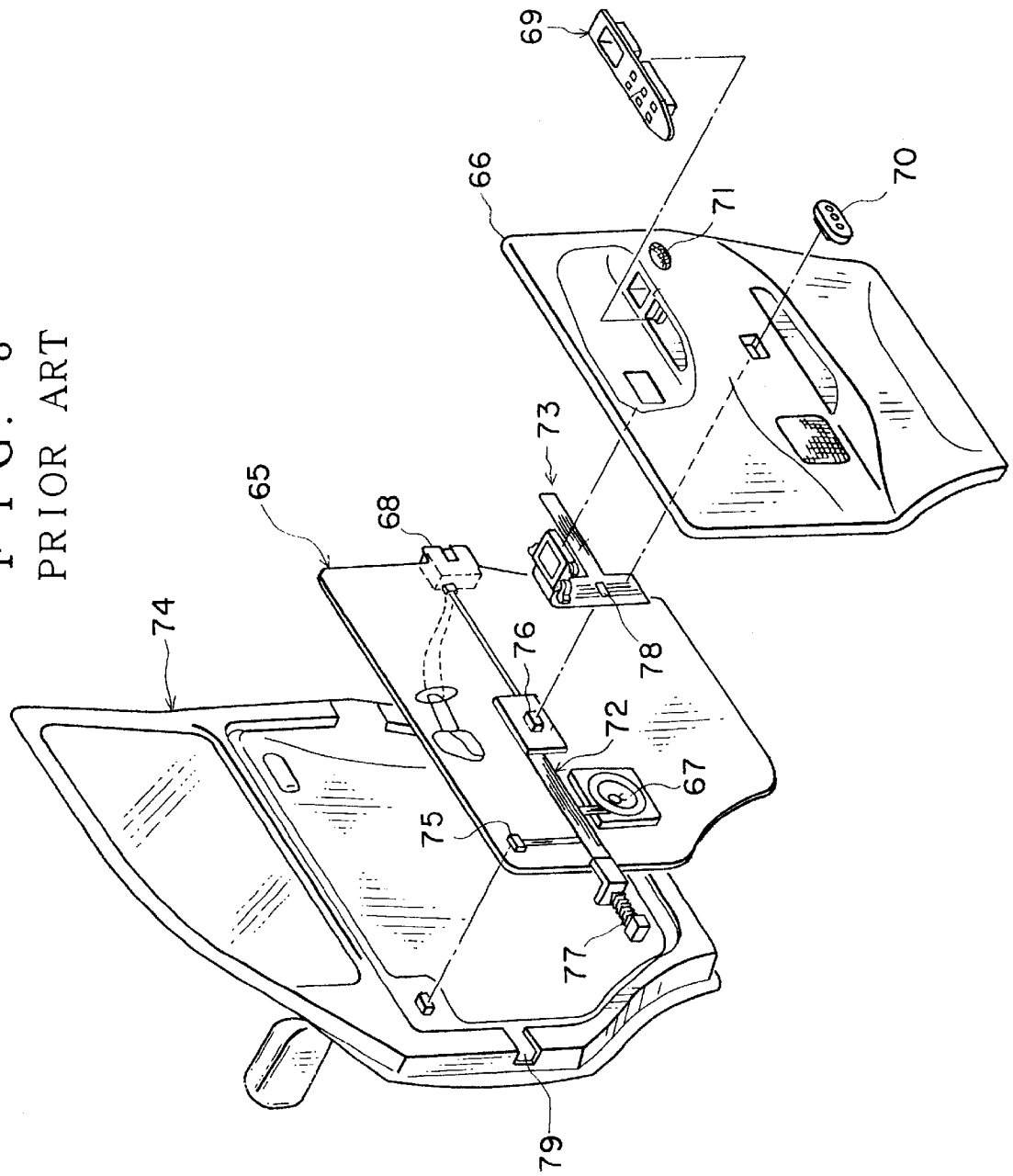
FIG. 8 is an exploded perspective view showing a prior art connecting structure of a vehicle door circuit unit.

As shown in FIG. 5, a tip 34a of the rib 34a contacts with the slant guide 42 of the connector 7 with the rotation of the door trim 5, and as shown in FIG. 6, the rib 34 turns upward in an arrow-direction Z3 about the flexible portion 25. This mechanism absorbs a deflection of position between the connectors 7 and 30. The rib 34 is smoothly inserted into the insertion space 51 along the slant guide 42. Upon assemblage of the door trim 5 onto the door pane 12, as shown in FIG. 7, the terminal conductor 16a on the rib 34 comes into contacts with the resilient contact piece 36a of the terminal 36, which makes an electrical connection between the connectors 7 and 30.

Referring to FIG. 1, the branch circuits 16,17, and 19 all extending downward from the main circuit 15 of the circuit unit 6 constitute the plurality of connectors 30–32 on the rib 34 lying in about the vertical middle of the door trim 5, and these connectors 30–32 simultaneously come into contact with the respective connectors 7–9 of the speaker unit 2, the power-window unit 3, and the door-lock unit 4 all installed on the inner door panel 1.

And, the branch circuits 22a and 22b both extending upward from the main circuit 15 constitute the connectors 33a and 33b on the rib 35 located at the upper part of the door trim 5, and these connectors 33a and 33b come into contact with the respective connectors 14a and 14b of the door-mirror unit 13 installed on the outer door panel 11. The rib 35 has the same flexibility as the rib 34 and also the connectors 14a and 14b have the same structure as the connectors 7,8, and 9.

Further, as shown in FIG. 1, a door lamp connection portion 44 is provided at the end of the branch circuit 20 extending backward from the main circuit 15 of the circuit unit 6. A front end portion 23 of the main circuit 15 projects over the front end of the door trim 5 through an extendable circuit portion 47. The front end portion 23 of the main circuit 15 is provided with a connector 48 connected to a connector on a vehicle body side.

According to the present invention as described hereinabove, smooth and sure connection of connectors can be performed with a smooth insertion of a projection along a slant guide into a connector by means of rotation of a projection about a flexible portion even in case of a substrate approaching the connector slantingly or rotatively.

And, a door trim can be assembled onto a door panel without a deflection by means of rotatably hanging the door trim on the door panel, while connecting connectors on both the panels smoothly and surely.

Further, a plurality of connectors can be simultaneously connected with a common projection, and the plurality of connectors can be arranged according to an arrangement, for example, of each accessory on a vehicle door, while simplifying form of a door trim.

What is claimed is:

1. A connector connecting structure for an automotive vehicle door having a door panel and a door trim, wherein said door trim is pivotally assembled with said door panel, comprising:

a projection with a first terminal conductor, said projection being orthogonally arranged on said door trim and having a flexible basal end portion; and a connector with a second terminal conductor, said connector being provided on said door panel and having a slant guide for slidably guiding said projection, whereby said projection is bendingly and slidingly inserted into said connector along said slant guide when said door trim is pivotally assembled to said door panel to connect said first terminal conductor with said second terminal conductor.

2. The connector connecting structure according to claim 1, wherein said projection is formed to be a long rib and said connector has a rib insertion space having an opening at a front end portion of said connector throughout longitudinal ends thereof, and wherein a plurality of said connectors are arranged in a line corresponding to said long rib, whereby said plurality of said connectors are simultaneously connected with said projection.

* * * * *